US012197673B2

(12) United States Patent
Ye et al.

(10) Patent No.: US 12,197,673 B2
(45) Date of Patent: Jan. 14, 2025

(54) OLED DISPLAY PANEL AND OLED DISPLAY DEVICE

(71) Applicant: Wuhan China Star Optoelectronics Semiconductor Display Technology Co., Ltd., Wuhan (CN)

(72) Inventors: Jian Ye, Wuhan (CN); Pengfei Liang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/602,788

(22) PCT Filed: Sep. 13, 2021

(86) PCT No.: PCT/CN2021/117946
§ 371 (c)(1),
(2) Date: Oct. 11, 2021

(87) PCT Pub. No.: WO2023/024178
PCT Pub. Date: Mar. 2, 2023

(65) Prior Publication Data
US 2024/0053850 A1    Feb. 15, 2024

(30) Foreign Application Priority Data
Aug. 27, 2021    (CN) .......................... 202110997416.5

(51) Int. Cl.
*H10K 59/131* (2023.01)
*G06F 3/041* (2006.01)
(Continued)

(52) U.S. Cl.
CPC ........ *G06F 3/04164* (2019.05); *G06F 3/0412* (2013.01); *G06F 3/0416* (2013.01);
(Continued)

(58) Field of Classification Search
CPC .................. H10K 59/40; H10K 59/131; G06F 2203/04111; G06F 3/0446; G06F 3/0443;
(Continued)

(56) References Cited

U.S. PATENT DOCUMENTS

2017/0017327 A1    1/2017  Chang

FOREIGN PATENT DOCUMENTS

| CN | 112086015 A | * | 12/2020 | |
| CN | 112860122 A | * | 5/2021 | ........... G06F 3/0412 |

* cited by examiner

*Primary Examiner* — Julie Anne Watko
(74) *Attorney, Agent, or Firm* — Nathan & Associates Menachem Nathan (57) ABSTRACT

An organic light emitting diode (OLED) display device, comprising: an OLED display panel, comprising a substrate, a driving circuit layer and a touch layer; wherein the OLED display panel further comprises a touch bonding terminal area and a display bonding terminal area, and the touch bonding terminal area is provided with a touch bonding terminal and the display bonding terminal area is provided with a display bonding terminal; a touch driving chip, comprising a touch connection terminal and a display connection terminal; and a flexible circuit board; wherein the flexible circuit board comprises a converting terminal and a converting line, and the touch bonding terminal is bonded to the converting terminal, and one end of the converting line is connected to the converting terminal and an other end of the converting line is connected to the touch connection terminal.

10 Claims, 9 Drawing Sheets

(51) Int. Cl.
*G06F 3/044* (2006.01)
*H10K 59/40* (2023.01)
(52) U.S. Cl.
CPC ......... *G06F 3/0446* (2019.05); *H10K 59/131* (2023.02); *G06F 3/0443* (2019.05); *G06F 2203/04111* (2013.01); *H10K 59/40* (2023.02)
(58) Field of Classification Search
CPC ... G06F 3/04164; G06F 3/0416; G06F 3/0412
See application file for complete search history.

FIG. 1

Prior Art

OLED DISPLAY PANEL AND OLED DISPLAY DEVICE

FIELD OF THE INVENTION

The present application relates to a display technology field, and more particularly to an OLED display panel and an OLED display device.

BACKGROUND OF THE INVENTION

With the development of display technology, in the existing mutual-capacitive Oncell (the touch layer is arranged between the light-emitting layer and the polarizer) OLED (Organic Light-Emitting Diode) display screen, the touch layer is arranged on the encapsulation layer to reduce the thickness of the display panel. The touch electrode is arranged on the encapsulation layer in the Oncell display device. The metal lines connecting the touch electrodes are extended down to the signal terminals on both sides of the bonding area through both sides, and then connected to the touch control chip through the signal terminals to realize the touch control function. The driving circuit realizes the driving function by connecting with the driving chip, so as to realize the touch control and driving functions of the display panel. However, since the transmitting signal line and the receiving signal line of the touch layer are connected to the signal terminals on the lower side of the display panel through both sides, and there are display signal lines among the transmitting signal lines and the receiving signal lines, resulting in parasitic capacitance between the touch signal line and the display signal line, thus leading to interference between the touch signal and the display signal, which affects the display effect and the touch effect.

Therefore, the technical problem of that mutual interference between the touch signal and the display signal exists in the existing Oncell display device, which is caused by the parasitic capacitance between the touch signal line and the display signal line.

SUMMARY OF THE INVENTION

The embodiment of the present application provides an OLED display panel and an OLED display device, so as to solve the technical problem of that mutual interference between the touch signal and the display signal caused by the parasitic capacitance between the touch signal line and the display signal line in the existing Oncell display device.

To solve the aforesaid problem, the technical solution of the present application is described as follows:

The embodiment of the present application provides an OLED display panel, comprising:
  a substrate;
  a driving circuit layer, arranged on one side of the substrate, and the driving circuit layer comprises a display signal line;
  a touch layer, arranged on one side of the driving circuit layer away from the substrate, and the touch layer comprises a touch signal line;
  wherein the OLED display panel further comprises a touch bonding terminal area and a display bonding terminal area, and the touch bonding terminal area is provided with a touch bonding terminal and the display bonding terminal area is provided with a display bonding terminal, and the touch signal line is connected to the touch bonding terminal on a side corresponding to the touch bonding terminal area and the display signal line is connected to the display bonding terminal on a side corresponding to the display bonding terminal area, and the touch bonding terminal area is arranged outside the display bonding terminal area.

In some embodiments, the touch bonding terminal area is arranged on one side of the display bonding terminal area, and the touch signal line is connected to the touch bonding terminal on a side corresponding to the touch bonding terminal area, and the display signal line is connected to the display bonding terminal on the other side corresponding to touch bonding terminal area, and the touch bonding terminal is insulated from the display bonding terminal.

In some embodiments, the touch bonding terminal area is arranged on a left side of the display bonding terminal area, or the touch bonding terminal area is arranged on a right side of the display bonding terminal area.

In some embodiments, the touch layer comprises:
  a touch metal layer, comprising a transmitting electrode, a receiving electrode arranged in an active area, and the touch signal line arranged in a non-display area, and the touch signal line comprises a transmitting signal line and a receiving signal line, and the transmitting electrode is connected to the transmitting signal line and the receiving electrode is connected to the receiving signal line;
  a touch insulation layer, arranged on a side of the touch metal layer;
  a conductive bridge, arranged on a side of the touch insulation layer away from the touch metal layer, and the conductive bridge connects adjacent transmitting electrodes;
  wherein the touch bonding terminal comprises a transmitting bonding terminal and a receiving bonding terminal, and the receiving signal line is connected to the receiving bonding terminal from one side of the active area, and the transmitting signal line is connected to the transmitting bonding terminal from a lower side of the active area.

In some embodiments, the transmitting bonding terminal and the receiving bonding terminal are arranged in a same row, and the receiving bonding terminal is arranged on a side of the transmitting bonding terminal away from the display bonding terminal area.

In some embodiments, the transmitting bonding terminal and the receiving bonding terminal are arranged in two rows, and the receiving bonding terminal is arranged on a side of the transmitting bonding terminal away from the display bonding terminal area.

In some embodiments, the touch layer comprises:
  a touch metal layer, comprising a transmitting electrode, a receiving electrode arranged in an active area, and the touch signal line arranged in a non-display area, and the touch signal line comprises a transmitting signal line and a receiving signal line, and the transmitting electrode is connected to the transmitting signal line and the receiving electrode is connected to the receiving signal line;
  a touch insulation layer, arranged on a side of the touch metal layer;
  a conductive bridge, arranged on a side of the touch insulation layer away from the touch metal layer, and the conductive bridge connects adjacent receiving electrodes;
  wherein the touch bonding terminal comprises a transmitting bonding terminal and a receiving bonding terminal, and the transmitting signal line is connected to the transmitting bonding terminal from one side of the active area, and the receiving signal line is connected to the receiving bonding terminal from a lower side of the active area.

In some embodiments, the touch bonding terminal area is arranged between the display bonding terminal areas, and the touch signal line is arranged between the display signal lines, and the display signal lines are connected to the display bonding terminals on two sides of the active area.

Meanwhile, the embodiment of the present application provides an OLED display device, comprising:
- an OLED display panel, comprising a substrate, a driving circuit layer and a touch layer, the driving circuit layer is arranged on one side of the substrate, and the driving circuit layer comprises a display signal line; the touch layer is arranged on one side of the driving circuit layer away from the substrate, and the touch layer comprises a touch signal line; wherein the OLED display panel further comprises a touch bonding terminal area and a display bonding terminal area, and the touch bonding terminal area is provided with a touch bonding terminal and the display bonding terminal area is provided with a display bonding terminal, and the touch signal line is connected to the touch bonding terminal on a side corresponding to the touch bonding terminal area and the display signal line is connected to the display bonding terminal on a side corresponding to the display bonding terminal area, and the touch bonding terminal area is arranged outside the display bonding terminal area;
- a touch driving chip, comprising a touch connection terminal and a display connection terminal;
- wherein the touch connection terminal is connected to the touch bonding terminal, and the display connection terminal is connected to the display bonding terminal.

In some embodiments, the touch connection terminal is correspondingly bonded to the touch bonding terminal, and the display connection terminal is correspondingly bonded to the display bonding terminal.

In some embodiments, the OLED display device further comprises a flexible circuit board, and the touch bonding terminal is connected to the flexible circuit board, and the flexible circuit board is connected to the touch connection terminal.

In some embodiments, the flexible circuit board comprises a converting terminal and a converting line, and the touch bonding terminal is bonded to the converting terminal, and one end of the converting line is connected to the converting terminal and the other end of the converting line is connected to the touch connection terminal.

In some embodiments, the touch signal line comprises a first signal line and a second signal line, and the first signal line is connected to the touch bonding terminal, and the flexible circuit board comprises a converting terminal and a converting line, and the touch bonding terminal is bonded to the converting terminal, and one end of the converting line is connected to the converting terminal and the other end of the converting line is connected to the second signal line, and the other end of the second signal line is connected to the touch connection terminal.

In some embodiments, the flexible circuit board comprises a converting terminal and a converting line, and the touch bonding terminal is bonded to the converting terminal, and one end of the converting line is connected to the converting terminal and the other end of the converting line is connected to the touch signal line, and the touch connection terminal is bonded to the touch bonding terminal.

In some embodiments, the touch bonding terminal area is arranged on one side of the display bonding terminal area, and the touch signal line is connected to the touch bonding terminal on a side corresponding to the touch bonding terminal area, and the display signal line is connected to the display bonding terminal on the other side corresponding to touch bonding terminal area, and the touch bonding terminal is insulated from the display bonding terminal.

In some embodiments, the touch bonding terminal area is arranged on a left side of the display bonding terminal area, or the touch bonding terminal area is arranged on a right side of the display bonding terminal area.

In some embodiments, the touch layer comprises:
- a touch metal layer, comprising a transmitting electrode, a receiving electrode arranged in an active area, and the touch signal line arranged in a non-display area, and the touch signal line comprises a transmitting signal line and a receiving signal line, and the transmitting electrode is connected to the transmitting signal line and the receiving electrode is connected to the receiving signal line;
- a touch insulation layer, arranged on a side of the touch metal layer;
- a conductive bridge, arranged on a side of the touch insulation layer away from the touch metal layer, and the conductive bridge connects adjacent transmitting electrodes;
- wherein the touch bonding terminal comprises a transmitting bonding terminal and a receiving bonding terminal, and the receiving signal line is connected to the receiving bonding terminal from one side of the active area, and the transmitting signal line is connected to the transmitting bonding terminal from a lower side of the active area.

In some embodiments, the transmitting bonding terminal and the receiving bonding terminal are arranged in a same row, and the receiving bonding terminal is arranged on a side of the transmitting bonding terminal away from the display bonding terminal area.

In some embodiments, the transmitting bonding terminal and the receiving bonding terminal are arranged in two rows, and the receiving bonding terminal is arranged on a side of the transmitting bonding terminal away from the display bonding terminal area.

In some embodiments, the touch layer comprises:
- a touch metal layer, comprising a transmitting electrode, a receiving electrode arranged in an active area, and the touch signal line arranged in a non-display area, and the touch signal line comprises a transmitting signal line and a receiving signal line, and the transmitting electrode is connected to the transmitting signal line and the receiving electrode is connected to the receiving signal line;
- a touch insulation layer, arranged on a side of the touch metal layer;
- a conductive bridge, arranged on a side of the touch insulation layer away from the touch metal layer, and the conductive bridge connects adjacent receiving electrodes;
- wherein the touch bonding terminal comprises a transmitting bonding terminal and a receiving bonding terminal, and the transmitting signal line is connected to the transmitting bonding terminal from one side of the active area, and the receiving signal line is connected to the receiving bonding terminal from a lower side of the active area.

Provided are an OLED display panel and an OLED display device; the OLED display panel comprises a substrate, a driving circuit layer and a touch layer, and the driving circuit layer is arranged on one side of the substrate, and the driving circuit layer comprises a display signal line, and the touch layer is arranged on one side of the driving circuit layer away from the substrate, and the touch layer comprises a touch signal line, wherein the OLED display panel further comprises a touch bonding terminal area and a display bonding terminal area, and the touch bonding terminal area is provided with a touch bonding terminal and the display bonding terminal area is provided with a display bonding terminal, and the touch signal line is connected to the touch bonding terminal on a side corresponding to the touch bonding terminal area and the display signal line is connected to the display bonding terminal on a side corresponding to the display bonding terminal area, and the touch bonding terminal area is arranged outside the display bonding terminal area. In the present application, the touch bonding terminal and the display bonding terminal are respectively arranged in two areas, and the touch bonding terminal area is arranged outside the display bonding terminal area. Thus, there is no cross between the touch bonding terminal and the display bonding terminal. Meanwhile, the touch signal line is connected to the touch bonding terminal on the side corresponding to the touch bonding terminal area and the display signal line is connected to the display bonding terminal on the side corresponding to the display bonding terminal area, such that there is no cross between the touch signal line and the display signal line. Therefore, the parasitic capacitance between the touch signal line and the display signal line can be avoided to prevent the interference between the touch signal and the display signal.

BRIEF DESCRIPTION OF THE DRAWINGS

The technical solution and the beneficial effects of the present application are best understood from the following detailed description with reference to the accompanying figures and embodiments.

DETAILED DESCRIPTION OF PREFERRED EMBODIMENTS

For better explaining the technical solution and the effect of the present invention, the present invention will be further described in detail with the accompanying drawings in the specific embodiments. It is clear that the described embodiments are merely part of embodiments of the present application, but not all embodiments. Based on the embodiments of the present application, all other embodiments to those of skilled in the premise of no creative efforts obtained, should be considered within the scope of protection of the present application.

Figure 1:
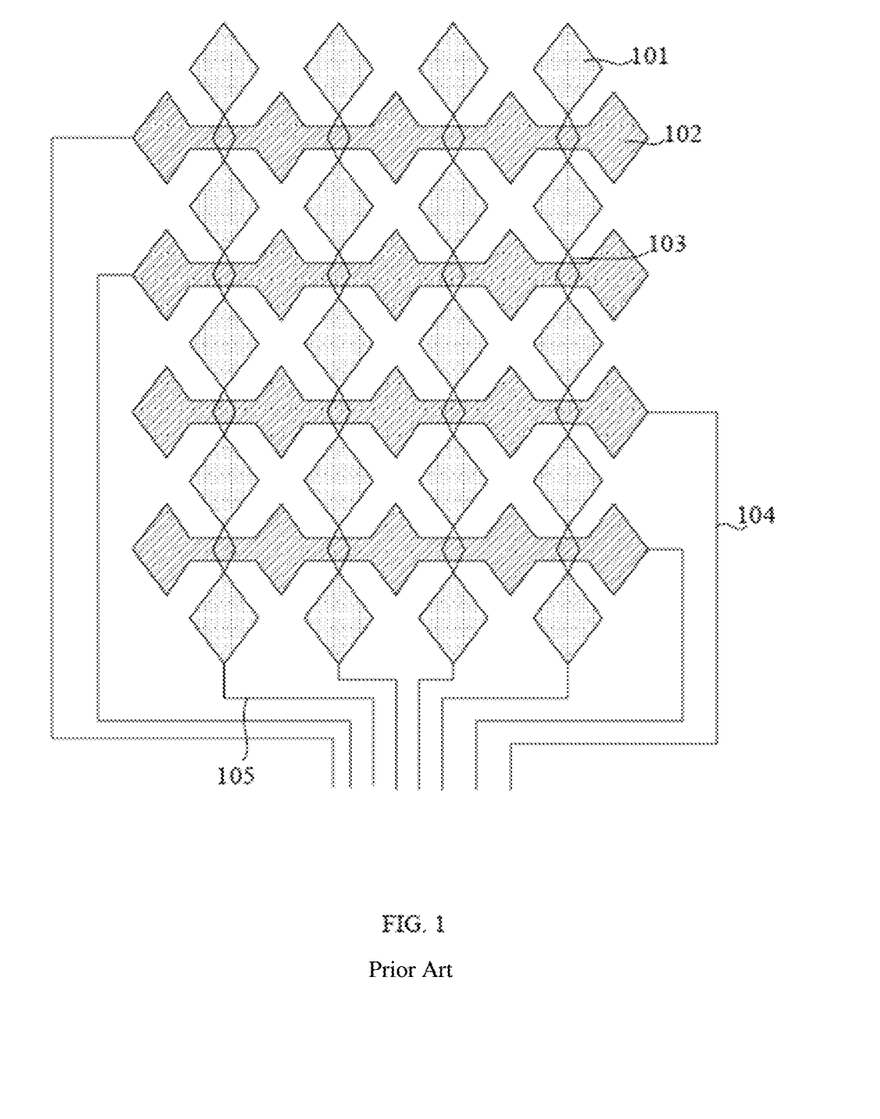
FIG. 1 is a schematic diagram of a conventional OLED display device.

As shown in FIG. 1, in the existing Oncell display device, the touch electrode comprises receiving electrodes 102 arranged in a horizontal direction and transmitting electrodes 101 arranged in a vertical direction. The transmitting electrodes 101 are connected by a conductive bridge 103 in other layer. In order to realize the touch function of the touch layer, the receiving electrode 102 is connected to the first metal line 104, and the emitting electrode 101 is connected to the second metal line 105, and the metal line 104 extends downwards through the two sides of the display area and is connected to the bonding area of the display device, so that the touch control chip can be connected to the bonding terminal to realize the touch function. As shown in FIG. 1, the touch signal line will pass through the two sides of the display panel and is connected to the bonding area, and the respective lines in the thin film transistor (such as data lines and scan lines) are also connected to the driving chip through the non-display area on both sides of the display panel. It results that there is cross between the display signal lines of the driving circuit layer and the touch signal lines. Thus, as implementing display and touch, the parasitic capacitance is formed between the display signal line and the touch signal line, thus leading to interference between the touch signal and the display signal, which affects the display effect and the touch effect. Therefore, the technical problem of that mutual interference between the touch signal and the display signal exists in the existing Oncell display device, which is caused by the parasitic capacitance between the touch signal line and the display signal line.

In view of the foregoing technical problems, the embodiment of the present application provides an OLED display panel and an OLED display device to solve the foregoing technical problems.

Figure 2:
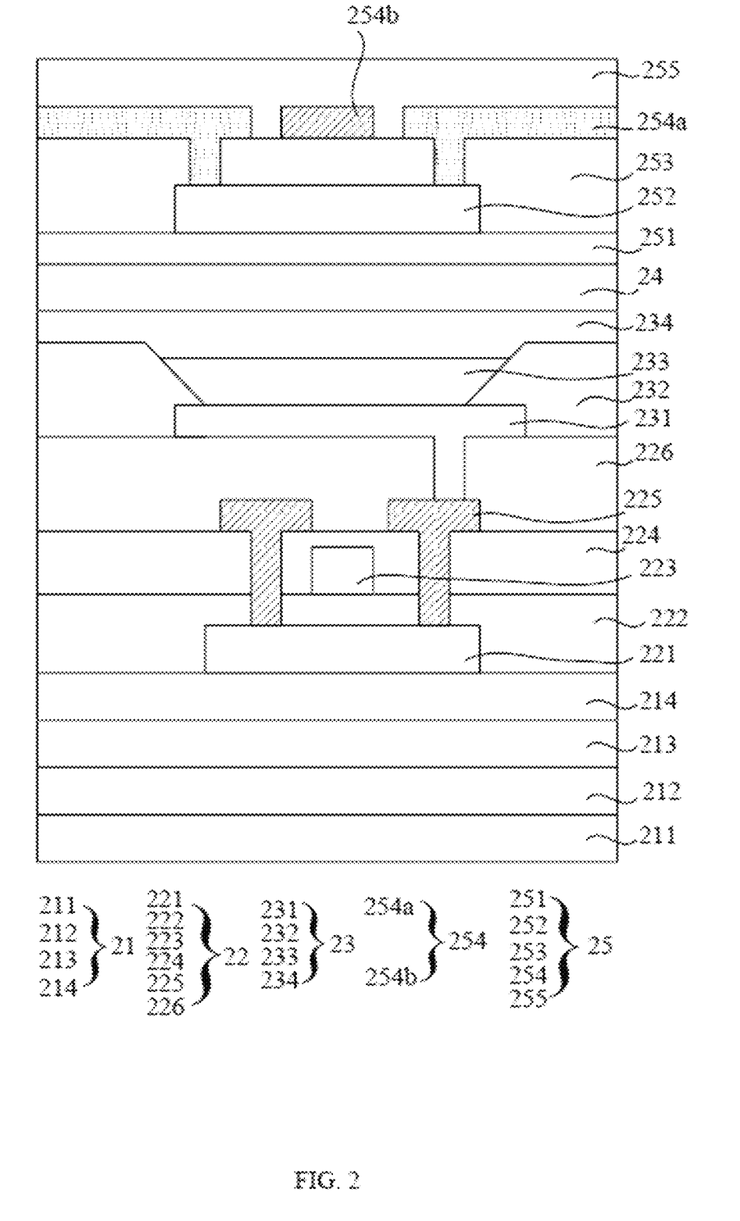
FIG. 2 is a first schematic diagram of an OLED display panel provided by one or more embodiments of the application.
Figure 3:
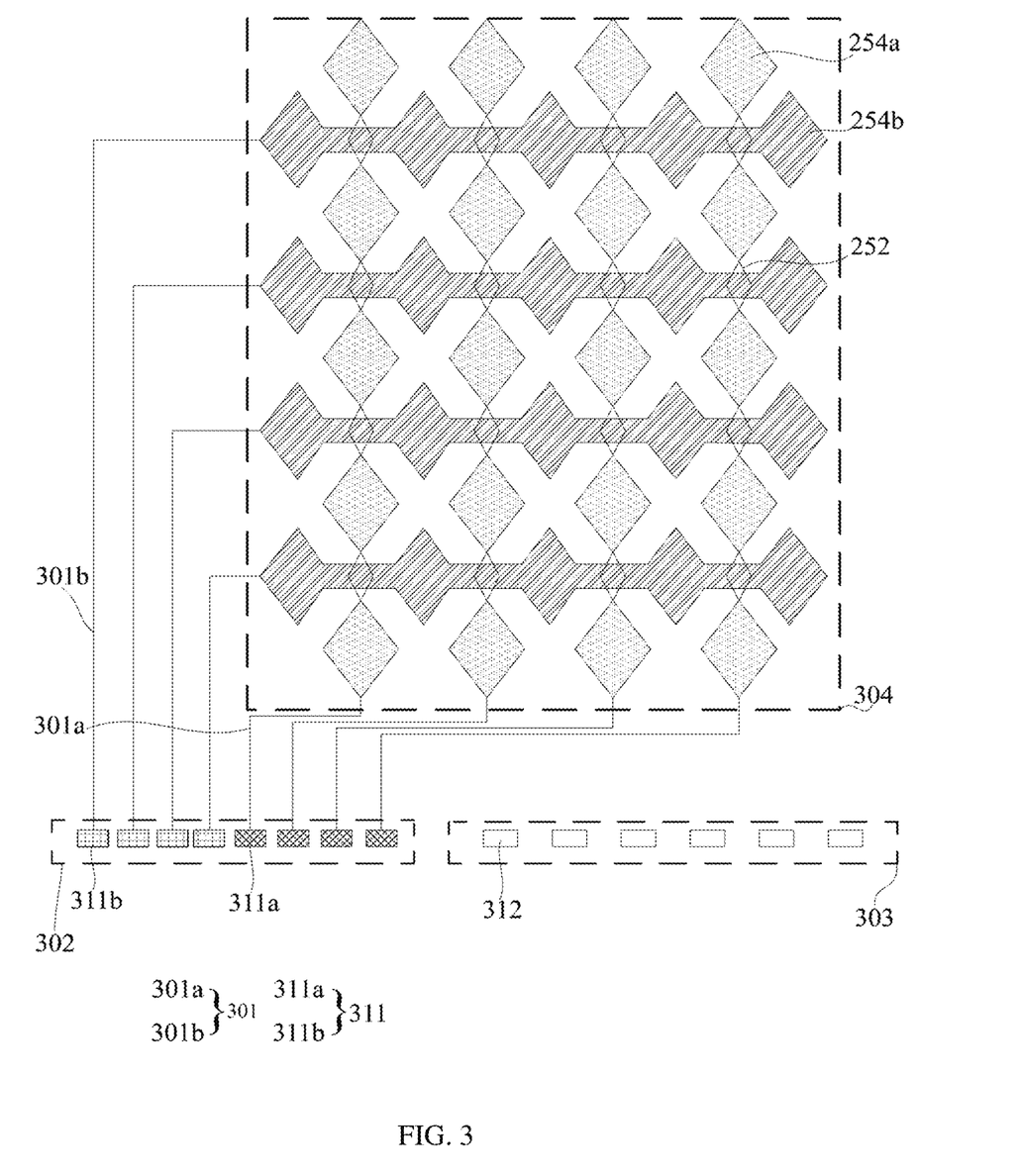
FIG. 3 is a second schematic diagram of an OLED display panel provided by one or more embodiments of the application.
Figure 4:
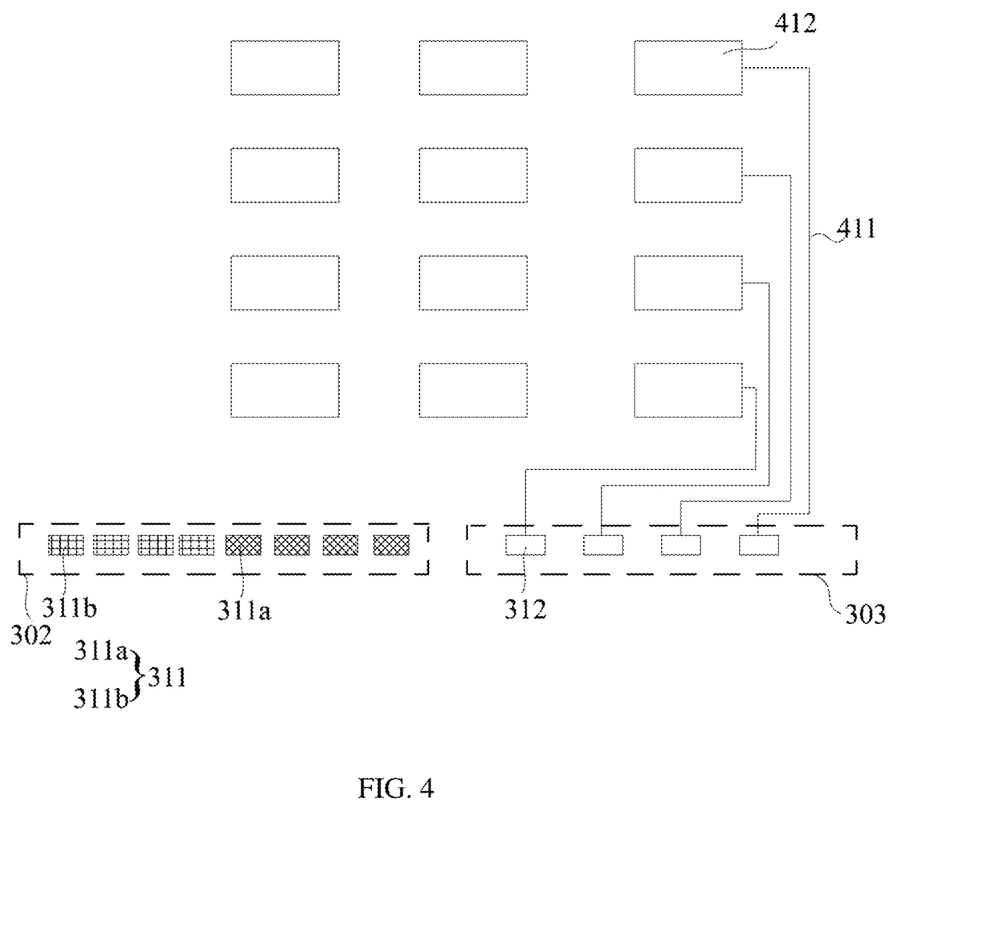
FIG. 4 is a third schematic diagram of an OLED display panel provided by one or more embodiments of the application.

As shown in FIG. 2, FIG. 3 and FIG. 4, the embodiment of the present application provides an OLED display panel, comprising:
  a substrate 21;
  a driving circuit layer 22, arranged on one side of the substrate 21, and the driving circuit layer 22 comprises a display signal line 411;
  a touch layer 25, arranged on one side of the driving circuit layer 22 away from the substrate 21, and the touch layer 25 comprises a touch signal line 301;
  wherein the OLED display panel further comprises a touch bonding terminal area 302 and a display bonding terminal area 303, and the touch bonding terminal area 302 is provided with a touch bonding terminal 311 and the display bonding terminal area 303 is provided with a display bonding terminal 312, and the touch signal line 301 is connected to the touch bonding terminal 311 on a side corresponding to the touch bonding terminal area 302 and the display signal line 411 is connected to the display bonding terminal 312 on a side corresponding to the display bonding terminal area 303, and the touch bonding terminal area 302 is arranged outside the display bonding terminal area 303.

The embodiment of the present application provides an OLED display panel. In the OLED display panel, the touch bonding terminal and the display bonding terminal are respectively arranged in two areas, and the touch bonding terminal area is arranged outside the display bonding terminal area. Thus, there is no cross between the touch bonding terminal and the display bonding terminal. Meanwhile, the touch signal line is connected to the touch bonding terminal on the side corresponding to the touch bonding terminal area and the display signal line is connected to the display bonding terminal on the side corresponding to the display bonding terminal area, such that there is no cross between the touch signal line and the display signal line. Therefore, the parasitic capacitance between the touch signal line and the display signal line can be avoided to prevent the interference between the touch signal and the display signal.

Specifically, since the touch layer and the driving circuit layer overlap in the vertical direction, the connection manner of the touch signal line 301 and the touch bonding terminal 311, and the connection manner of the display signal line 411 and the display bonding terminal 312 are respectively shown in FIG. 3 and FIG. 4.

Specifically, the display signal line comprises signal lines connected to data lines, scan lines, clock signal lines and other lines of implementing display functions. In order to facilitate the description of the connection manner of the display signal lines, in FIG. 4, the output terminal 412 shows the connection point of each line and the display signal that realizes the display function (FIG. 4 merely shows a portion of the connections of the output terminals 412 and the display signal lines 411), but the embodiments of the application are not limited to this. Since the lines of implementing display functions, the data lines, scan lines and clock signal lines can be directly connected to the display bonding terminals, the display signal lines can be the data lines, scan lines and clock signal lines of implementing display functions.

In one embodiment as shown in FIG. 3 and FIG. 4, the touch bonding terminal area 302 is arranged on one side of the display bonding terminal area 303, and the touch signal line 301 is connected to the touch bonding terminal 311 on a side corresponding to the touch bonding terminal area 302, and the display signal line 411 is connected to the display bonding terminal 312 on the other side corresponding to touch bonding terminal area 302, and the touch bonding terminal 311 is insulated from the display bonding terminal 312. By arranging the touch bonding terminal area on one side of the display bonding terminal area, the touch signal line can be connected to the touch bonding terminal from one side and the display signal line can be connected to the display bonding terminal from the other side, so as to avoid overlapping between touch signal line and display signal line, resulting in parasitic capacitance.

Figure 5:
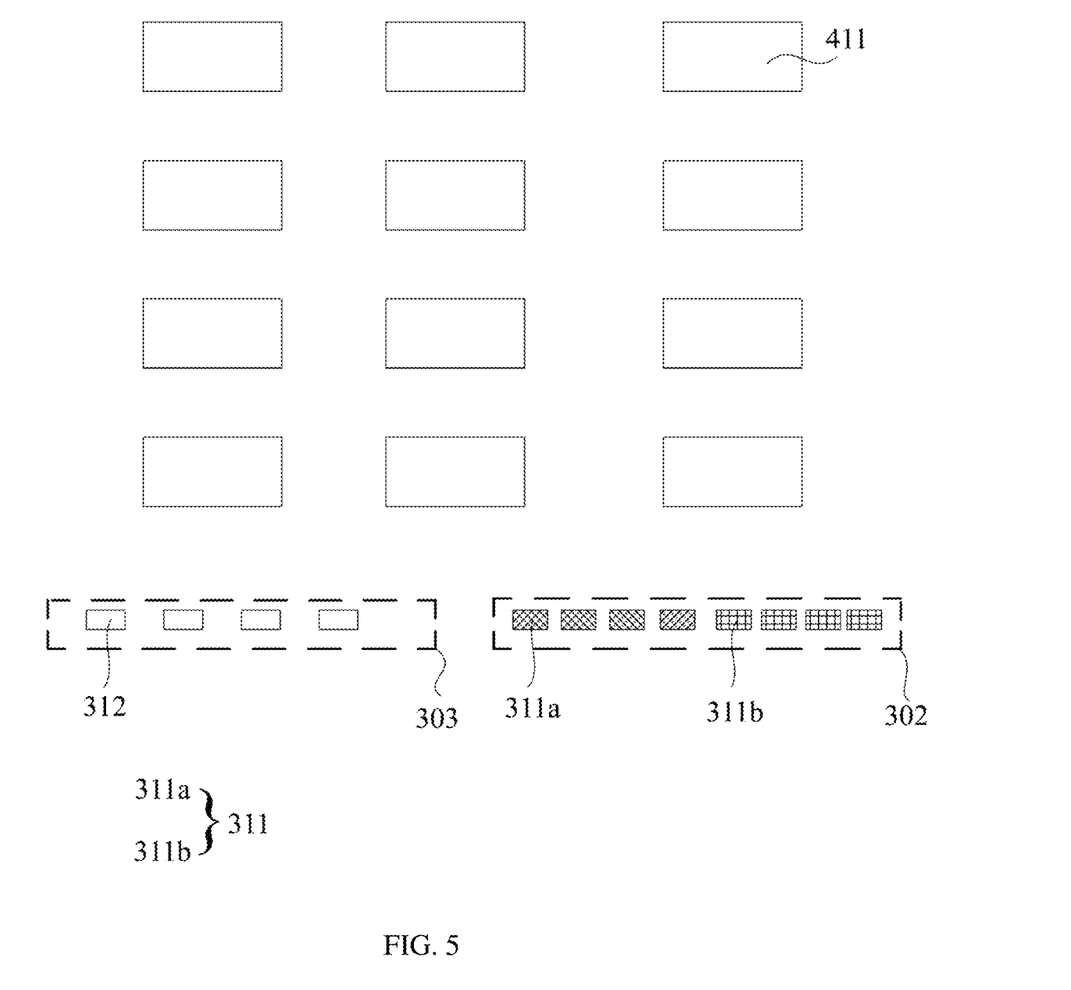
FIG. 5 is a fourth schematic diagram of an OLED display panel provided by one or more embodiments of the application.

Specifically, the touch bonding terminal area is arranged on a left side of the display bonding terminal area, or the touch bonding terminal area is arranged on a right side of the display bonding terminal area. As shown in FIG. 3 and FIG. 4, the touch bonding terminal area 302 is arranged on a left side of the display bonding terminal area 303. Correspondingly, the touch signal line extends downwards through the left side of the display area and is connected to the touch bonding terminal, and the display signal line extends downwards through the right side of the display panel and is connected to the display bonding terminal; as shown in FIG. 5, the touch bonding terminal area 302 is arranged on a right side of the display bonding terminal area 303. Correspondingly, the touch signal line extends downwards through the right side of the display area and is connected to the touch bonding terminal, and the display signal line extends downwards through the left side of the display panel and is connected to the display bonding terminal.

When the transmitting signal line and the receiving signal line are connected to the middle area of the bonding area, there will be a problem of parasitic capacitance existing at the crosses with the display signal line. In one embodiment as shown in FIG. 2 and FIG. 3, the touch layer 25 comprises:

a touch metal layer 254, comprising a transmitting electrode 254a, a receiving electrode 254b arranged in an active area 304, and the touch signal line 301 arranged in a non-display area, and the touch signal line 301 comprises a transmitting signal line 301a and a receiving signal line 301b, and the transmitting electrode 254a is connected to the transmitting signal line 301a and the receiving electrode 254b is connected to the receiving signal line 301b;

a touch insulation layer 253, arranged on a side of the touch metal layer 254;

a conductive bridge 252, arranged on a side of the touch insulation layer 253 away from the touch metal layer 254, and the conductive bridge 252 connects adjacent receiving electrodes 254a;

wherein the touch bonding terminal 311 comprises a transmitting bonding terminal 311a and a receiving bonding terminal 311b, and the receiving signal line 301b is connected to the receiving bonding terminal 311b from one side of the active area 304, and the transmitting signal line 301a is connected to the transmitting bonding terminal 311a from a lower side of the active area 304.

Specifically, FIG. 3 is illustrated. The receiving signal line 301b is connected downwards from the left side of the active area 304 to the receiving bonding terminal 311b, and the transmitting signal line 301a is connected from the lower side of the active area 304 to the transmitting bonding terminal 311a. Since the receiving bonding terminal and the transmitting bonding terminal are both arranged in the touch bonding terminal area, the transmitting signal line will be connected to the transmitting bonding terminal by bending the transmitting signal line when the transmitting signal line cannot be directly connected to the transmitting bonding terminal. The display bonding terminal is arranged on the right side of the touch bonding terminal area, the display signal line will only be connected to the display bonding terminal from the right side of the display area when the display signal line is connected from the right side to the display bonding terminal. Thus, there is no cross with the receiving signal line and the transmitting signal line, thereby avoiding the problem of parasitic capacitance caused by the cross of the display signal line with the transmitting signal line and the receiving signal line.

In one embodiment as shown in FIG. 3, the transmitting bonding terminal 311a and the receiving bonding terminal 311b are arranged in the same row, and the receiving bonding terminal 311b is arranged on a side of the transmitting bonding terminal 311a away from the display bonding terminal area 312. By arranging the transmitting bonding terminal and the receiving bonding terminal in the same row, when the transmitting signal line and the receiving signal line are respectively connected to the transmitting bonding terminal and the receiving bonding terminal, they can be directly connected to the transmitting bonding terminal and the receiving bonding terminal to shorten the lengths of the transmitting signal line and the receiving signal line thereby reducing the attenuation of the electrical signal. Moreover, the receiving bonding terminal is arranged on a side of the transmitting terminal away from the display bonding terminal, the lengths of the transmitting signal line and the receiving signal line can be shortened and the problem of cross between the transmitting signal line and the receiving signal line can also be avoided.

Figure 6:
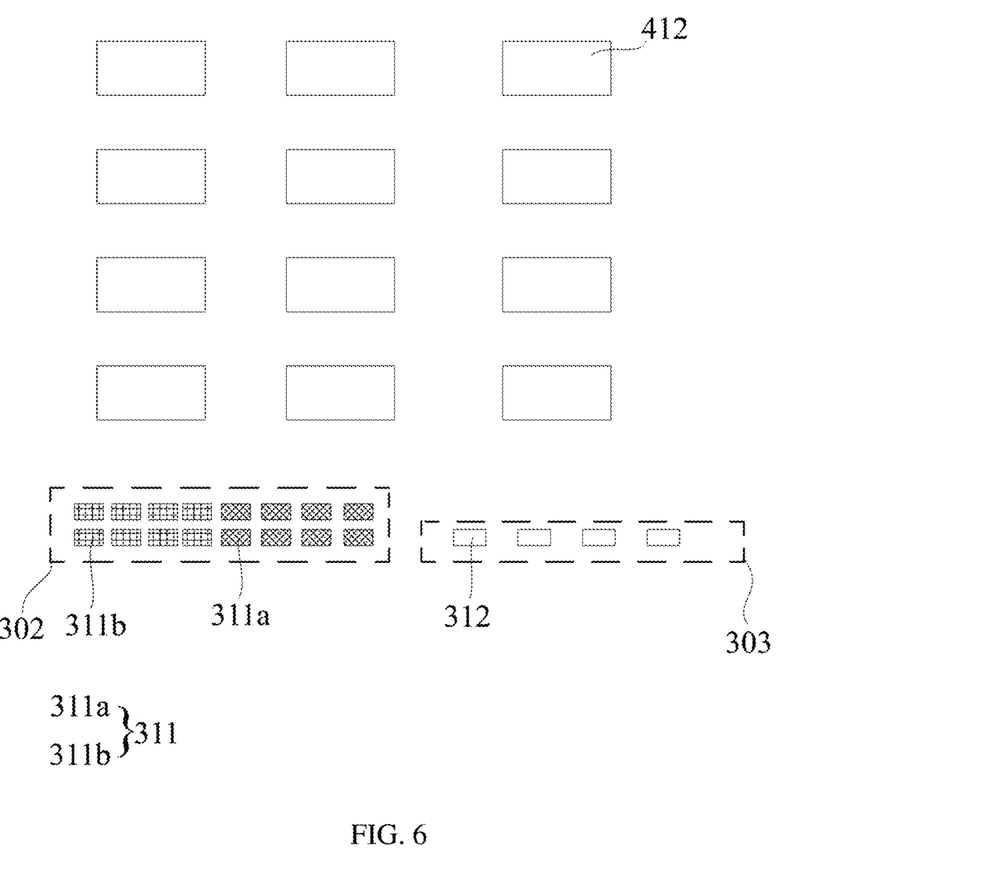
FIG. 6 is a fifth schematic diagram of an OLED display panel provided by one or more embodiments of the application.

As regarding the transmitting bonding terminal and the receiving bonding terminal to be arranged in the same row, it will cause the technical problem that the length of the bonding area is larger. As shown in FIG. 6, in one embodiment, the transmitting bonding terminal 311a and the receiving bonding terminal 311b are arranged in two rows, and the receiving bonding terminal 311b is arranged on a side of the transmitting bonding terminal 311a away from the display bonding terminal area 303. By arranging the transmitting bonding terminal and the receiving bonding terminal in two rows, the length of the bonding area of the OLED display panel is small to avoid excessively large borders on both sides of the OLED display panel.

Specifically, when the touch bonding terminal area is arranged on a left side of the display bonding terminal area, the transmitting bonding terminal and the receiving bonding terminal can be arranged in two rows. Then, the receiving bonding terminal is arranged at the left side of the transmitting bonding terminal; when the touch bonding terminal area is arranged on a right side of the display bonding terminal area, the transmitting bonding terminal and the receiving bonding terminal can be arranged in two rows. Then, the receiving bonding terminal is arranged at the right side of the transmitting bonding terminal.

Specifically, when the transmitting electrodes are connected through a conductive bridge, the transmission direction of the electrical signal of the transmitting electrode is vertical, and the transmission direction of the electrical signal of the receiving electrode is horizontal. Then, the transmitting bonding terminal is arranged on one side close to the display bonding terminal area to avoid the cross of lines.

In one embodiment, the touch layer comprises:
a touch metal layer, comprising a transmitting electrode, a receiving electrode arranged in an active area, and the touch signal line arranged in a non-display area, and the touch signal line comprises a transmitting signal line and a receiving signal line, and the transmitting electrode is connected to the transmitting signal line and the receiving electrode is connected to the receiving signal line;
a touch insulation layer, arranged on a side of the touch metal layer;
a conductive bridge, arranged on a side of the touch insulation layer away from the touch metal layer, and the conductive bridge connects adjacent receiving electrodes;
wherein the touch bonding terminal comprises a transmitting bonding terminal and a receiving bonding terminal, and the transmitting signal line is connected to the transmitting bonding terminal from one side of the active area, and the receiving signal line is connected to the receiving bonding terminal from a lower side of the active area.

Specifically, when the receiving electrodes are connected through a conductive bridge, the transmitting signal line is connected to the transmitting bonding terminal from one side of the active area, and the receiving signal line is connected to the receiving bonding terminal from the lower side of the active area. Then, the touch signal line can be arranged on one side of the touch bonding terminal area to prevent the parasitic capacitance caused by the cross of the touch signal line with the display signal line, from effecting the display effect and the touch effect.

The aforesaid embodiment illustrates the arrangement of the transmitting bonding terminal and the receiving bonding terminal when the conductive bridge connects the adjacent transmitting electrodes. When the conductive bridge connects the adjacent receiving electrodes, the arrangement of the transmitting bonding terminal and the receiving bonding terminal can be determined, correspondingly. For instance, the transmitting bonding terminal and the receiving bonding terminal is arranged in the same row, the receiving bonding terminal is arranged on one side close to the display bonding terminal area, and the transmitting bonding terminal, the receiving bonding terminal, the transmitting signal line and the receiving signal line can be correspondingly arranged. The repeated description is omitted here.

In one embodiment, the touch bonding terminal area is arranged between the display bonding terminal areas, and the touch signal line is arranged between the display signal lines, and the display signal lines are connected to the display bonding terminals on two sides of the active area. By arranging the touch bonding terminal area between the display bonding terminal areas, the touch signal line is arranged between the display signal lines. The touch signal line is connected downwards to the touch bonding terminal, and the display signal lines are connected to the display bonding terminals on two sides. There is no cross between the touch signal line and the display signal line to avoid the parasitic capacitance between the touch signal line and the display signal line.

Figure 7:
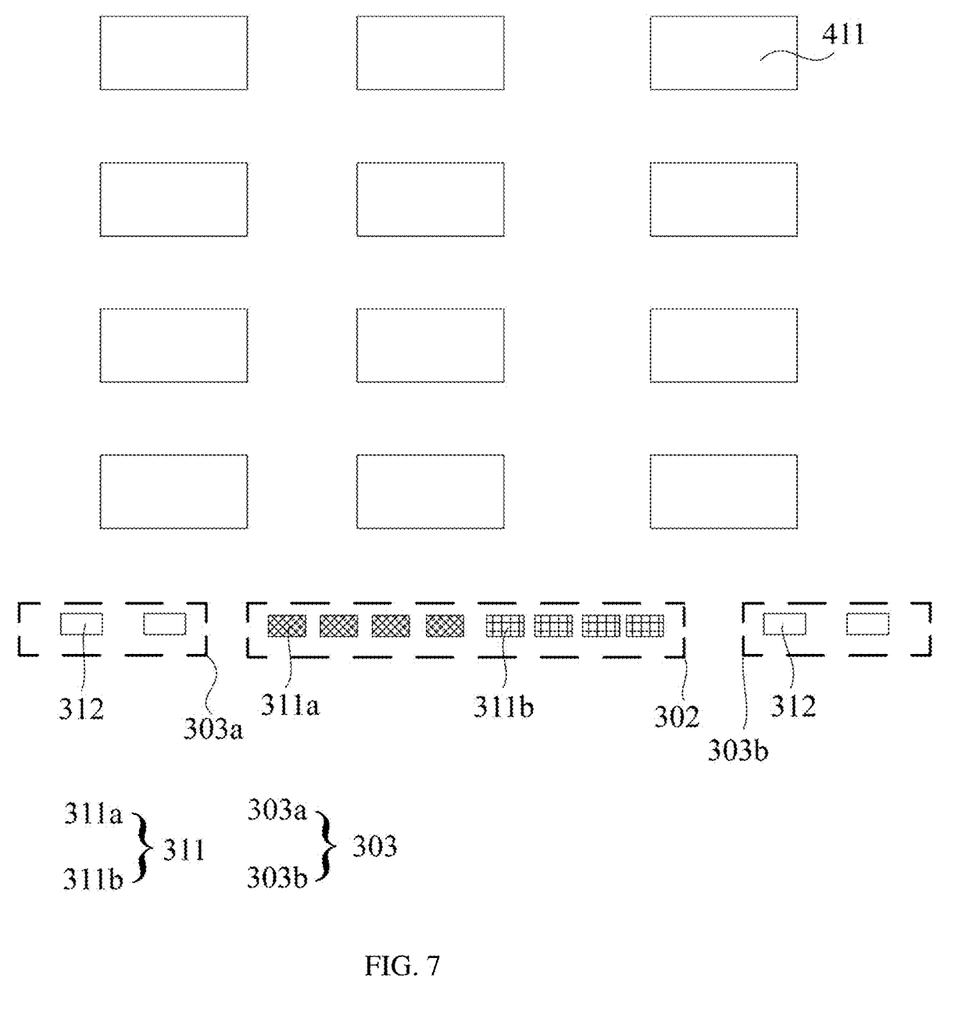
FIG. 7 is a sixth schematic diagram of an OLED display panel provided by one or more embodiments of the application.

Specifically, as shown in FIG. 7, the display bonding terminal area 303 comprises a left display bonding terminal area 303a and a right display bonding terminal area 303b. The touch bonding terminal area 302 is arranged between the left display bonding terminal area 303a and the right display bonding terminal area 303b. Correspondingly, the touch signal line can be downwards directly connected to the touch bonding terminal, and the display signal lines can be connected to the display bonding terminal area from the two sides to avoid the parasitic capacitance between the touch signal line and the display signal line.

Specifically, as shown in FIG. 7, the receiving bonding terminal 311b is arranged at the left side of the transmitting bonding terminal 311a, but the embodiment of the present application is not limited thereto. The receiving bonding terminal can be arranged at the right side of the transmitting bonding terminal.

Specifically in FIG. 7, the receiving bonding terminal 311b and the transmitting bonding terminal 311a are arranged in the same row, but the embodiment of the present application is not limited thereto. The receiving bonding terminal and the transmitting bonding terminal can be arranged in two rows.

In one embodiment as shown in FIG. 2, the substrate 21 comprises a protective layer 211, a polyimide layer 212, a barrier layer 213 and a buffer layer 214.

In one embodiment as shown in FIG. 2, the driving circuit layer 22 comprises an active layer 221, a gate insulating layer 222, a gate layer 223, an interlayer insulating layer 224, a source and drain layer 225 and a planarization layer 226, but the embodiment of the present application is not limited thereto. The driving circuit layer may comprise at least one of a bottom gate thin film transistor and a top gate thin film transistor, or the driving circuit layer may comprise a thin film transistor with a double gate structure. The driving circuit layer may comprise a first metal layer and a second metal layer. The first metal layer forms a gate and the second metal layer forms a capacitance plate.

In one embodiment as shown in FIG. 2, the OLED display panel further comprises a light-emitting function layer 23. The light-emitting function layer 23 comprises a pixel electrode layer 231, a pixel defining layer 232, a light-emitting material layer 233 and a common electrode layer 234.

In one embodiment as shown in FIG. 2, the OLED display panel further comprises an encapsulation layer 24, which comprises a first inorganic layer, an organic layer and a second inorganic layer.

In one embodiment, the touch layer 25 further comprises a touch buffer layer 251 and a touch barrier layer 255.

Figure 8:
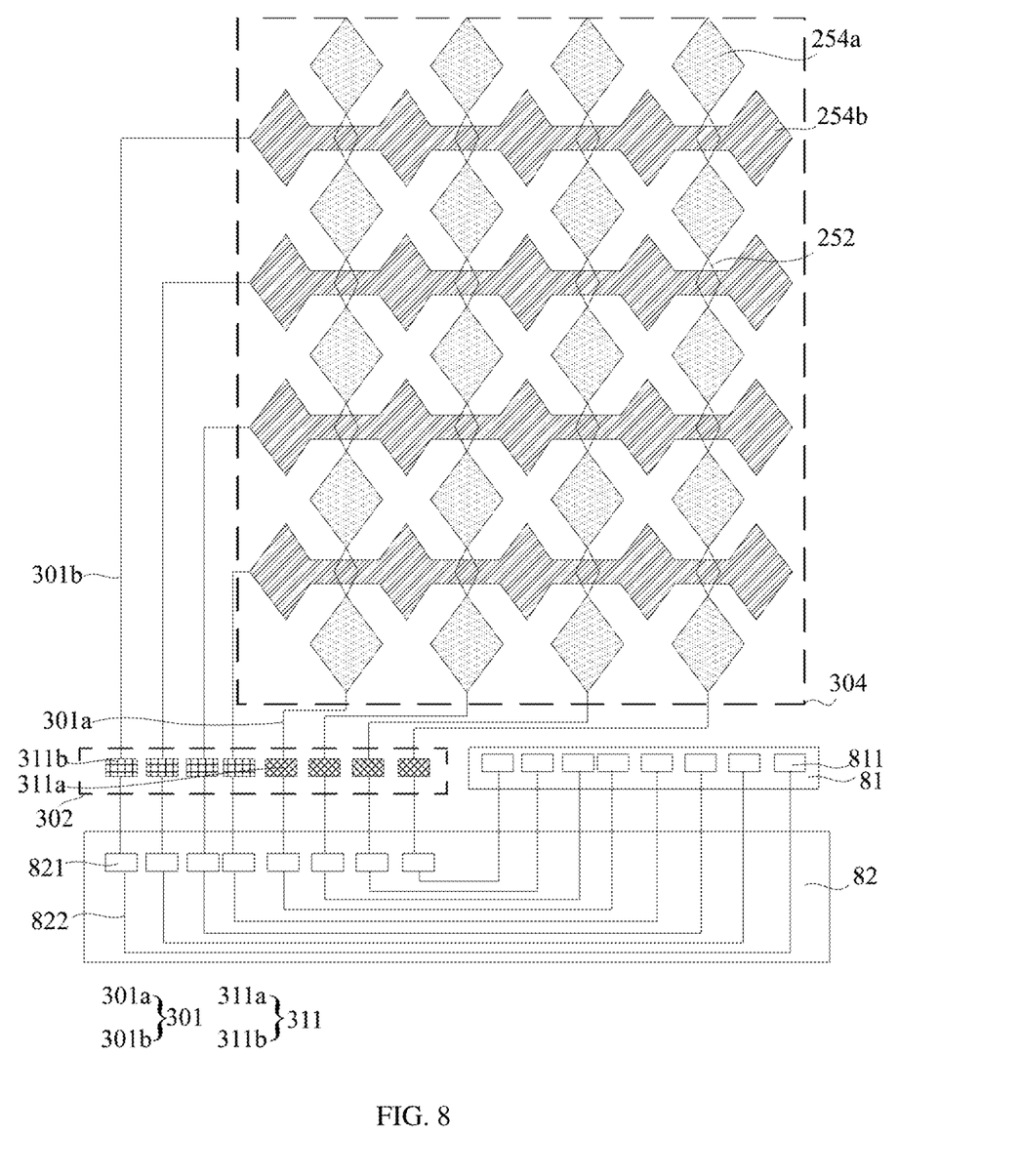
FIG. 8 is a schematic diagram of an OLED display device provided by one or more embodiments of the application.

As shown in FIG. 2, FIG. 4 and FIG. 8, the embodiment of the present application provides an OLED display device, comprising:

an OLED display panel, comprising a substrate 21, a driving circuit layer 22 and a touch layer 25, and the driving circuit layer 22 is arranged on one side of the substrate 21, and the driving circuit layer 22 comprises a display signal line 411, and the touch layer 25 is arranged on one side of the driving circuit layer 22 away from the substrate 21, and the touch layer 25 comprises a touch signal line 301, wherein the OLED display panel further comprises a touch bonding terminal area 302 and a display bonding terminal area 303, and the touch bonding terminal area 302 is provided with a touch bonding terminal 311 and the display bonding terminal area 303 is provided with a display bonding terminal 312, and the touch signal line 301 is connected to the touch bonding terminal 311 on a side corresponding to the touch bonding terminal area 302 and the display signal line 411 is connected to the display bonding terminal 312 on a side corresponding to the display bonding terminal area 303, and the touch bonding terminal area 302 is arranged outside the display bonding terminal area 303;

a touch driving chip 81, comprising a touch connection terminal 811 and a display connection terminal (not shown in FIG. 8);

wherein the touch connection terminal 811 is connected to the touch bonding terminal 311, and the display connection terminal is connected to the display bonding terminal 312.

The embodiment of the present application provides an OLED display device. In the OLED display device, the touch bonding terminal and the display bonding terminal are respectively arranged in two areas, and the touch bonding terminal area is arranged outside the display bonding terminal area. Thus, there is no cross between the touch bonding terminal and the display bonding terminal. Meanwhile, the touch signal line is connected to the touch bonding terminal on the side corresponding to the touch bonding terminal area and the display signal line is connected to the display bonding terminal on the side corresponding to the display bonding terminal area, such that there is no cross between the touch signal line and the display signal line. Therefore, the parasitic capacitance between the touch signal line and the display signal line can be avoided to prevent the interference between the touch signal and the display signal. Meanwhile, the touch control chip and the driving chip are integrated into the touch driving chip, so that the touch connection terminal is connected to the touch bonding terminal and the display connection terminal is connected to the display bonding terminal to realize the display function and touch function of the touch driving chip on the OLED display panel.

In one embodiment, the touch connection terminal is correspondingly bonded to the touch bonding terminal, and the display connection terminal is correspondingly bonded to the display bonding terminal. Namely, as setting the touch driving chip, the touch driving chip can be directly bonded to the touch bonding terminal and the display bonding terminal to realize the display function and touch function of the touch driving chip on the OLED display panel.

As regarding the touch bonding terminal to be directly connected to the touch connection terminal, it will cause inconvenience to test the touch bonding terminal. In one embodiment, the OLED display device further comprises a flexible circuit board, and the touch bonding terminal is connected to the flexible circuit board, and the flexible circuit board is connected to the touch connection terminal. By connecting the touch bonding terminal to the flexible circuit board, and then connecting the flexible circuit board to the touch connection terminal, the connection of the touch bonding terminal and the touch connection terminal can be realized. Since the touch bonding terminal to the flexible circuit board, the touch bonding terminal can be tested through the flexible circuit board, which reduces the difficulty of testing the touch layer.

Specifically as shown in FIG. 8, the flexible circuit board 82 comprises a converting terminal 821 and a converting line 822, and the touch bonding terminal 311 is bonded to the converting terminal 821, and one end of the converting line 822 is connected to the converting terminal 821 and the other end of the converting line 822 is connected to the touch connection terminal 811.

Specifically, FIG. 8 shows the converting terminal and the touch bonding terminal, and the touch bonding terminal and the converting terminal are connected with line. However, in practical arrangement, the connection can be realized with bonding the converting terminal and the touch bonding terminal. As arranging the converting line, it can be extended to the OLED display panel to realize the connection of the touch bonding terminal and the touch connection terminal. When the touch layer is tested, the touch layer can be tested through the converting terminal to reduce the difficulty of testing.

In one embodiment, the touch signal line comprises a first signal line and a second signal line, and the first signal line is connected to the touch bonding terminal, and the flexible circuit board comprises a converting terminal and a converting line, and the touch bonding terminal is bonded to the converting terminal, and one end of the converting line is connected to the converting terminal and the other end of the converting line is connected to the second signal line, and the other end of the second signal line is connected to the touch connection terminal. When the touch bonding terminal and the touch connection terminal are connected through the flexible circuit board, the touch electrode and the touch bonding terminal are connected through the first signal line. Meanwhile, the second signal line is formed on the OLED display panel. After bonding the touch bonding terminal and the touch connection terminal, one end of the converting line in the flexible circuit board is connected to the converting terminal and the other end of the converting line is connected to the second signal line at the junction of the flexible circuit board and the OLED display panel, such that the other end of the second signal line is connected to the touch connection terminal to realize the connection of the touch bonding terminal and the touch connection terminal.

In one embodiment, the flexible circuit board comprises a converting terminal and a converting line, and the touch bonding terminal is bonded to the converting terminal, and one end of the converting line is connected to the converting terminal and the other end of the converting line is connected to the touch signal line, and the touch connection terminal is bonded to the touch bonding terminal. After connecting touch bonding terminal to the converting terminal, the converting terminal is reconnected to the touch signal line. The touch bonding terminal is bonded to the touch connection terminal, thereby reducing the occupied area of the terminals and the lines.

Figure 9:
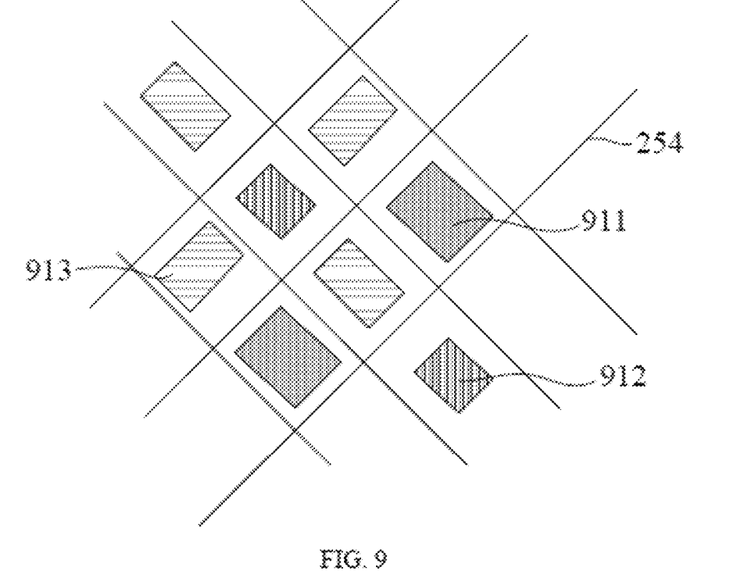
FIG. 9 is a first schematic diagram of light-emitting pixels provided by one or more embodiments of the application.
Figure 10:
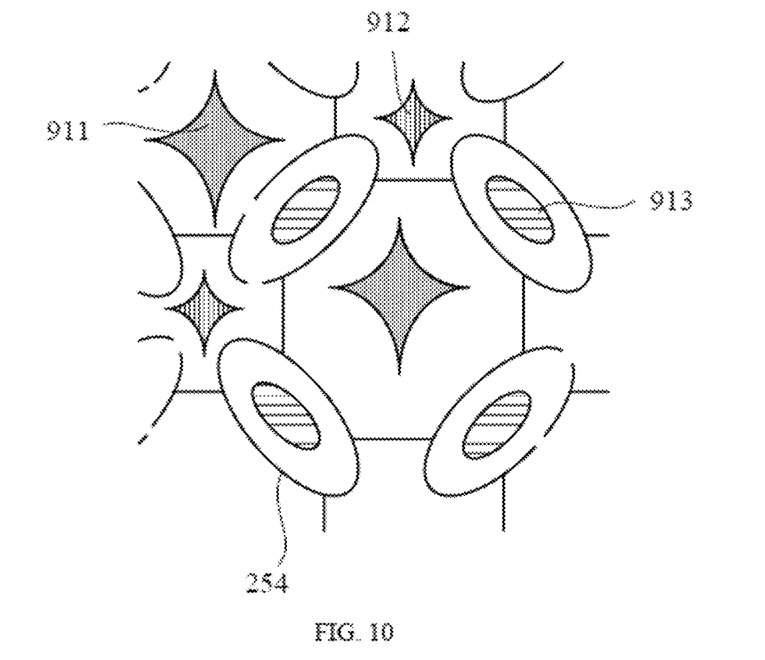
FIG. 10 is a second schematic diagram of light-emitting pixels provided by one or more embodiments of the application.

In one embodiment as shown in FIG. 9, when the light-emitting pixels are quadrilaterals, such as the blue light-emitting pixel 911, the red light-emitting pixel 912 and the green light-emitting pixel 913 in FIG. 9 are quadrilaterals, the corresponding touch layers can be arranged in a straight line. However, the embodiment of the present application is not limited thereto. As shown in FIG. 10, when the light-emitting pixel has an ellipse or other curved structure, such as the blue light-emitting pixel 911, the red light-emitting pixel 912 and the green light-emitting pixel 913 in FIG. 10 are curved arcs, the corresponding touch layer can be arranged in a curve.

In one embodiment of the OLED display device, the touch bonding terminal area is arranged on one side of the display bonding terminal area, and the touch signal line is connected to the touch bonding terminal on a side corresponding to the touch bonding terminal area, and the display signal line is connected to the display bonding terminal on the other side corresponding to touch bonding terminal area, and the touch bonding terminal is insulated from the display bonding terminal.

In one embodiment of the OLED display device, the touch bonding terminal area is arranged on a left side of the display bonding terminal area, or the touch bonding terminal area is arranged on a right side of the display bonding terminal area.

In one embodiment of the OLED display device, the touch layer comprises:
- a touch metal layer, comprising a transmitting electrode, a receiving electrode arranged in an active area, and the touch signal line arranged in a non-display area, and the touch signal line comprises a transmitting signal line and a receiving signal line, and the transmitting electrode is connected to the transmitting signal line and the receiving electrode is connected to the receiving signal line;
- a touch insulation layer, arranged on a side of the touch metal layer;
- a conductive bridge, arranged on a side of the touch insulation layer away from the touch metal layer, and the conductive bridge connects adjacent transmitting electrodes;
wherein the touch bonding terminal comprises a transmitting bonding terminal and a receiving bonding terminal, and the receiving signal line is connected to the receiving bonding terminal from one side of the active area, and the transmitting signal line is connected to the transmitting bonding terminal from a lower side of the active area.

In one embodiment of the OLED display device, the transmitting bonding terminal and the receiving bonding terminal are arranged in a same row, and the receiving bonding terminal is arranged on a side of the transmitting bonding terminal away from the display bonding terminal area.

In one embodiment of the OLED display device, the transmitting bonding terminal and the receiving bonding terminal are arranged in two rows, and the receiving bonding terminal is arranged on a side of the transmitting bonding terminal away from the display bonding terminal area.

In one embodiment of the OLED display device, the touch layer comprises:
- a touch metal layer, comprising a transmitting electrode, a receiving electrode arranged in an active area, and the touch signal line arranged in a non-display area, and the touch signal line comprises a transmitting signal line and a receiving signal line, and the transmitting electrode is connected to the transmitting signal line and the receiving electrode is connected to the receiving signal line;
- a touch insulation layer, arranged on a side of the touch metal layer;
- a conductive bridge, arranged on a side of the touch insulation layer away from the touch metal layer, and the conductive bridge connects adjacent receiving electrodes;
wherein the touch bonding terminal comprises a transmitting bonding terminal and a receiving bonding terminal, and the transmitting signal line is connected to the transmitting bonding terminal from one side of the active area, and the receiving signal line is connected to the receiving bonding terminal from a lower side of the active area.

In one embodiment of the OLED display device, the touch bonding terminal area is arranged between the display bonding terminal areas, and the touch signal line is arranged between the display signal lines, and the display signal lines are connected to the display bonding terminals on two sides of the active area.

It can be known according to the above embodiment:

The embodiment of the present application provides an OLED display panel and an OLED display device, and the OLED display panel comprises a substrate, a driving circuit layer and a touch layer, and the driving circuit layer is arranged on one side of the substrate, and the driving circuit layer comprises a display signal line, and the touch layer is arranged on one side of the driving circuit layer away from the substrate, and the touch layer comprises a touch signal line, wherein the OLED display panel further comprises a touch bonding terminal area and a display bonding terminal area, and the touch bonding terminal area is provided with a touch bonding terminal and the display bonding terminal area is provided with a display bonding terminal, and the touch signal line is connected to the touch bonding terminal on a side corresponding to the touch bonding terminal area and the display signal line is connected to the display bonding terminal on a side corresponding to the display bonding terminal area, and the touch bonding terminal area is arranged outside the display bonding terminal area. In the present application, the touch bonding terminal and the display bonding terminal are respectively arranged in two areas, and the touch bonding terminal area is arranged outside the display bonding terminal area. Thus, there is no cross between the touch bonding terminal and the display bonding terminal. Meanwhile, the touch signal line is connected to the touch bonding terminal on the side corresponding to the touch bonding terminal area and the display signal line is connected to the display bonding terminal on the side corresponding to the display bonding terminal area, such that there is no cross between the touch signal line and the display signal line. Therefore, the parasitic capacitance between the touch signal line and the display signal line can be avoided to prevent the interference between the touch signal and the display signal.

In the foregoing embodiments, the description of the various embodiments have respective different emphases, and a part in some embodiment, which is not described in detail can be referred to the related description of other embodiments.

The OLED display panel and OLED display device provided by the embodiments of the present application is described in detail as aforementioned, and the principles and implementations of the present application have been described with reference to specific illustrations. The description of the foregoing embodiments is merely for helping to understand the technical solutions of the present application and the core ideas thereof; those skilled in the art should understand that the technical solutions described in the foregoing embodiments may be modified, or some of the technical features may be equivalently replaced; and the modifications or replacements do not deviate from the spirit and scope of the technical solutions of the embodiments of the present application.

What is claimed is:

1. An organic light emitting diode (OLED) display device, comprising:
    an OLED display panel, comprising a substrate, a driving circuit layer and a touch layer, and the driving circuit layer is arranged on one side of the substrate, and the driving circuit layer comprises a display signal line; the touch layer is arranged on one side of the driving circuit layer away from the substrate, and the touch layer comprises a touch signal line; wherein the OLED display panel further comprises a touch bonding terminal area and a display bonding terminal area, and the touch bonding terminal area is provided with a touch bonding terminal and the display bonding terminal area is provided with a display bonding terminal, and the touch signal line is connected to the touch bonding terminal on a side corresponding to the touch bonding terminal area and the display signal line is connected to the display bonding terminal on a side corresponding to the display bonding terminal area, and the touch bonding terminal area is arranged outside the display bonding terminal area;
    a touch driving chip, comprising a touch connection terminal and a display connection terminal; and
    a flexible circuit board, wherein the touch bonding terminal is connected to the flexible circuit board, and the flexible circuit board is connected to the touch connection terminal;
    wherein the touch connection terminal is connected to the touch bonding terminal, and the display connection terminal is connected to the display bonding terminal; and
    wherein the flexible circuit board comprises a converting terminal and a converting line, and the touch bonding terminal is bonded to the converting terminal, and one end of the converting line is connected to the converting terminal and an other end of the converting line is connected to the touch connection terminal.

2. The OLED display device according to claim 1, wherein the touch connection terminal is correspondingly bonded to the touch bonding terminal, and the display connection terminal is correspondingly bonded to the display bonding terminal.

3. The OLED display device according to claim 1, wherein the touch signal line comprises a first signal line and a second signal line, and the first signal line is connected to the touch bonding terminal, and the flexible circuit board comprises a converting terminal and a converting line, and the touch bonding terminal is bonded to the converting terminal, and one end of the converting line is connected to the converting terminal and an other end of the converting line is connected to the second signal line, and an other end of the second signal line is connected to the touch connection terminal.

4. The OLED display device according to claim 1, wherein the flexible circuit board comprises a converting terminal and a converting line, and the touch bonding terminal is bonded to the converting terminal, and one end of the converting line is connected to the converting terminal and an other end of the converting line is connected to the touch signal line, and the touch connection terminal is bonded to the touch bonding terminal.

5. The OLED display device according to claim 1, wherein the touch bonding terminal area is arranged on one side of the display bonding terminal area, and the touch signal line is connected to the touch bonding terminal on a side corresponding to the touch bonding terminal area, and the display signal line is connected to the display bonding terminal on an other side corresponding to display bonding terminal area, and the touch bonding terminal is insulated from the display bonding terminal.

6. The OLED display device according to claim 5, wherein the touch bonding terminal area is arranged on a left side of the display bonding terminal area, or the touch bonding terminal area is arranged on a right side of the display bonding terminal area.

7. The OLED display device according to claim 5, wherein the touch layer comprises:
    a touch metal layer, comprising one or more transmitting electrodes, one or more receiving electrodes arranged in an active area, and the touch signal line arranged in a non-display area, and the touch signal line comprises a transmitting signal line and a receiving signal line, and the transmitting electrode is connected to the transmitting signal line and the receiving electrode is connected to the receiving signal line;
    a touch insulation layer, arranged on a side of the touch metal layer;
    a conductive bridge, arranged on a side of the touch insulation layer away from the touch metal layer, and the conductive bridge connects adjacent ones of the transmitting electrodes;
    wherein the touch bonding terminal comprises a transmitting bonding terminal and a receiving bonding terminal, and the receiving signal line is connected to the receiving bonding terminal from one side of the active area, and the transmitting signal line is connected to the transmitting bonding terminal from a lower side of the active area.

8. The OLED display device according to claim 7, wherein the transmitting bonding terminal and the receiving bonding terminal are arranged in a same row, and the receiving bonding terminal is arranged on a side of the transmitting bonding terminal away from the display bonding terminal area.

9. The OLED display device according to claim 7, wherein the transmitting bonding terminal and the receiving bonding terminal are arranged in two rows, and the receiving bonding terminal is arranged on a side of the transmitting bonding terminal away from the display bonding terminal area.

10. The OLED display device according to claim 5, wherein the touch layer comprises:
   a touch metal layer, comprising one or more transmitting electrodes, one or more receiving electrodes arranged in an active area, and the touch signal line arranged in a non-display area, and the touch signal line comprises a transmitting signal line and a receiving signal line, and the transmitting electrode is connected to the transmitting signal line and the receiving electrode is connected to the receiving signal line;
   a touch insulation layer, arranged on a side of the touch metal layer;
   a conductive bridge, arranged on a side of the touch insulation layer away from the touch metal layer, and the conductive bridge connects adjacent ones of the receiving electrodes;
   wherein the touch bonding terminal comprises a transmitting bonding terminal and a receiving bonding terminal, and the transmitting signal line is connected to the transmitting bonding terminal from one side of the active area, and the receiving signal line is connected to the receiving bonding terminal from a lower side of the active area.

* * * * *